OHMIC CONTACT TO SEMICONDUCTOR

Filed May 5, 1967

INVENTORS
EIICHI MARUYAMA
IKUE UCHINO
BY
Paul M. Craig, Jr.
ATTORNEY

United States Patent Office 3,515,954
Patented June 2, 1970

3,515,954

OHMIC CONTACT TO SEMICONDUCTOR

Eiichi Maruyama, Hachioji-shi, and Ikue Uchino, Tachikawa-shi, Japan, assignors to Hitachi, Ltd., Tokyo, Japan, a corporation of Japan Filed May 5, 1967, Ser. No. 636,348
Int. Cl. H01l *11/04, 7/10*
U.S. Cl. 317—234 9 Claims

ABSTRACT OF THE DISCLOSURE

An ohmic contact to a semiconductor is maintained not only at room temperature but also very low temperatures by providing a layer of degenerate carriers in the surface of the semiconductor crystal at which the contact is made by introducing an impurity into the semiconductor crystal to a concentration of $10^{17}/cm.^3$ or more.

The present invention relates to an ohmic contact electrode to a semiconductor, and more particularly to an ohmic contact electrode to a semiconductor maintaining low resistance ohmic contact even at a very low temperature of 20° K. or lower.

The present invention will be described with reference to the attached drawings, in which FIG. 1 is a diagram showing a state of a boundary potential barrier at the surface boundary of a semiconductor and a conventional ohmic contact electrode of the second kind;

In general, when a semiconductor is in contact with a metal, a potential barrier develops at the boundary, resulting in a non-ohmic contact. However, when the work function of the metal is lower than that of, for example, an n-type semiconductor, such a potential barrier does not develop, resulting in an ohmic contact. This ohmic contact is called an ohmic contact of the first kind.

Figure 1:
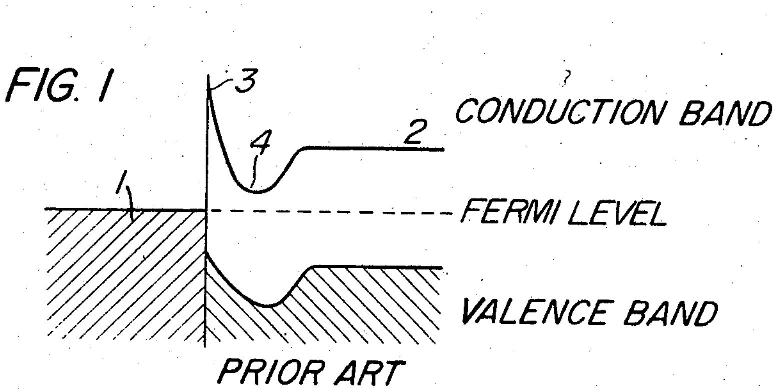

Even in case the work function of the metal is lower than that of the semiconductor as stated above, often a potential barrier develops at the boundary, when a contact electrode is formed, due to oxidation or contamination. However, even in such a non-ohmic contact, when indium (In) or gallium (Ga) is in contact with cadmium sulphide (CdS), for example, an n-type layer 4 which is low resistive as compared with a CdS bulk crystal is formed near the contact surface as shown in FIG. 1, since In and Ga make an intimate contact easily with CdS and further they act as donors for CdS. This low resistive layer 4 serves as an electron reservoir and supplies, when a voltage is applied, electrons to the bulk crystal without any barrier. On the other hand, a potential barrier 3 formed between a metal electrode 1 and the low resistive layer 4 is so thin due to a high donor concentration in the low resistive layer 4 that electrons can penetrate the barrier freely due to the tunnel effect. In such a case, even if a potential barrier has developed, the influence thereof can be ignored. This contact is called an ohmic contact of the second kind, as differentiated from the aforesaid ohmic contact of the first kind. However, even in such an ohmic contact, free electrons in the low resistive layer 4 drop back into the original donor levels, resulting in a decrease in an ionized donor concentration at low temperatures around the liquid hydrogen temperature. Since the thickness of the potential barrier is generally inversely proportional to the square root of the ionized donor concentration, the thickness of the potential barrier increases at low temperatures, and hence the influence of the barrier on contact characteristics cannot be neglected. Thus, an ohmic contact of the second kind becomes a non-ohmic contact at low temperatures.

Figure 2:
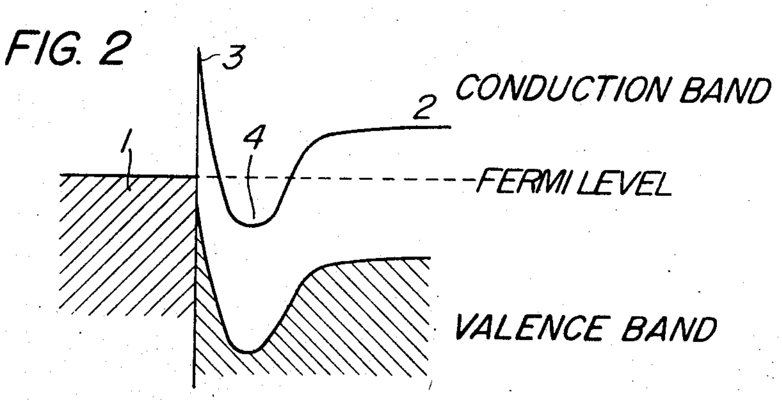
PRIOR ART FIG. 2
FIG. 2 is a diagram showing a state of a boundary potential barrier at the surface boundary of a semiconductor and an ohmic contact electrode according to the present invention.

However, when the donor concentration in the n-type low resistive layer 4 is about $10^{17}/cm.^3$ or more, the donor levels of the low resistive layer 4 overlap the levels of the conduction band, and hence the electrons are in a state of so-called fermic degeneracy as shown in FIG. 2. Since the free electron density is independent of temperature in a degenerate state, the ionized donor concentration contributing to the potential barrier does not decrease, even at very low temperatures, resulting in the realization of an ohmic contact of the second kind even at very low temperatures.

An object of the present invention is to prevent an ohmic contact of the second kind from becoming a non-ohmic contact at low temperatures, and more particularly to prevent a potential barrier from becoming thick due to a decrease in an ionized donor concentration at low temperatures.

Now, embodiments of the present invention will be described.

EXAMPLE 1

In order to form a low resistive layer containing $10^{17}/cm.^3$ or more donors in the surface of a CdS single crystal, the donor impurity is diffused into the crystal from the surface thereof, or a layer of CdS containing the high concentration of donor impurity is deposited on the CdS surface. Impurities acting as donors for CdS are Group III elements such as boron (B), aluminum (Al), gallium (Ga) and indium (In) and Group VII elements such as chlorine (Cl), bromine (Br) and iodine (I). An excess cadmium can also act as a donor. Among others B, Al, Ga, and In can be diffused into the crystal by being applied as coatings to or vacuum deposited on the surface of the crystal as oxides thereof or as elements themselves and then by subjecting the crystal to a heat treatment. For example, a desired low resistive layer can be obtained by maintaining the CdS crystal coated with an aqueous solution of boron trioxide ($B_2O_3$) at a temperature of 600° C. for one hour in a hydrogen atmosphere.

The desired low resistive layer can also be formed by subjecting the crystal to a heat treatment in an atmosphere containing a donor impurity as a vapour. For example, the desired low resistive layer can be formed by maintaining the CdS crystal at 600° C. for one hour in an argon atmosphere containing gallium vapour. Further, a layer of CdS containing a high concentration of donors may be formed on the surface of the crystal. To this end, a vacuum deposition is carried out on a desired surface of the crystal by employing CdS powder or micro-crystals containing a high concentration of donor impurity as a source of evaporation. Then, the low resistive layer can be obtained by subjecting the crystal to an appropriate heat treatment. Alternatively, the low resistive layer can be a layer grown by a method such as the epitaxial growth method on the desired crystal surface. For example, such a low resistive layer can be formed on the CdS crystal surface by vapour depositing a low resistive CdS to a thickness of 3 to 5$\mu$ on the crystal which is heated to 150° C., and then subjecting the crystal to a heat treatment for 30 min. at 400° C. in an inert atmosphere.

Figure 3:
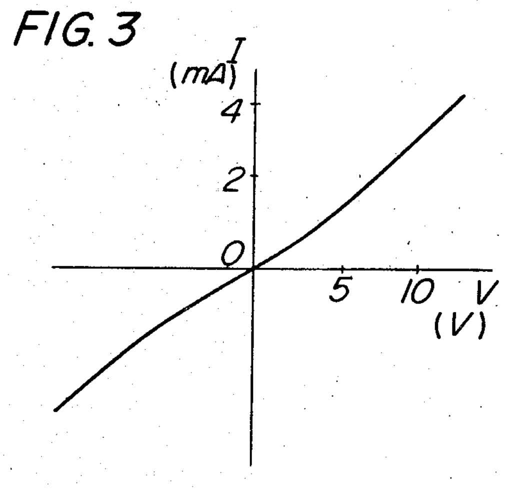
FIG. 3 is a graph of a current versus voltage characteristic of an ohmic contact to a semiconductor according to the present invention at a very low temperature.
Figure 4:
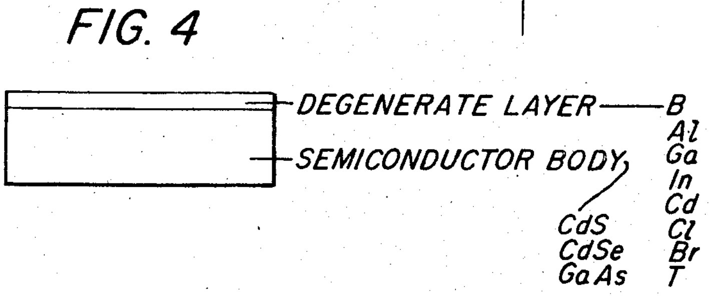
FIG. 4 shows diagrammatically the structure of the semiconductor device of the present invention.

A current versus voltage characteristic at 4.2° K. of one of thus obtained CdS crystals having an ohmic contact according to the invention is shown in FIG. 3 in which the ordinate represents current and the abscissa represents voltage. This specimen was made by diffusing boron into a CdS crystal from the surface thereof and then an indium electrode was attached to the crystal by an alloying process. It is evident from FIG. 3 that an ohmic contact is made to the crystal.

EXAMPLE 2

By maintaining a gallium arsenide (GaAs), on which tin (Sn) is placed, at 600° C. for one hour in a hydrogen atmosphere, an ohmic contact electrode to the semiconductor containing an amount of Sn of the order of $10^{17}/\text{cm.}^3$ and having a required degenerate layer at the surface thereof can be formed.

EXAMPLE 3

By diffusing indium (In) placed on a cadmium selenide (CdSe) into the cadmium selenide at 600° to 700° C. in a hydrogen atmosphere, an ohmic contact electrode to the CdSe containing In of an amount of $10^{17}/\text{cm.}^3$ or more and having a required degenerate layer at its surface can be formed.

The ohmic contact electrodes of Examples 2 and 3 show current versus voltage characteristics as shown in FIG. 3 even at very low temperatures.

Thus, a D.C. measurement at very low temperatures which has been impossible so far has become possible, and also the use of the devices utilizing an acousto-electric effect such as ultrasonic amplification at very low temperatures has become possible. Since the lifetime of phonons becomes longer as temperature lowers, the use of the acousto-electric effect at very low temperatures elevates the efficiency of the devices. Also, the use of injection luminescent devices at very low temperatures becomes possible and moreover the efficiency thereof is remarkably improved.

What is claimed is:

1. A semiconductor device having an ohmic contact suitable for use at low temperatures comprising a semiconductor body selected from the group consisting of a cadmium sulphide crystal, a cadmium selenide crystal and a gallium arsenide crystal, said body containing a layer of degenerate carrier selected from the group consisting of elements of Groups III and VII of the Periodic Table, said layer having an impurity concentration of least $10^{17}/\text{cm.}^3$ provided in the surface of said semiconductor body.

2. The semiconductor device of claim 1, wherein the degenerate carrier is an element or its corresponding oxide selected from the group consisting of boron, aluminum, gallium, indium, chlorine, bromine and iodine.

3. The semiconductor device of claim 1, wherein the semiconductor body is gallium arsenide and the degenerate carrier is tin.

4. The semiconductor device of claim 1, wherein the semiconductor body is cadmium selenide and the degenerate carrier is indium.

5. The semiconductor device of claim 1, wherein the layer of degenerate carrier has a thickness of about 3 to 5 microns.

6. The semiconductor device of claim 1, wherein said semiconductor body is selected from the group consisting of cadmium sulphide and cadmium selenide.

7. The semiconductor device of claim 6, wherein said degenerate carrier is an element selected from the group consisting of Group III and Group VII of the Periodic table.

8. The semiconductor device of claim 6, wherein the degenerate carrier is an element or its corresponding oxide selected from the group consisting of boron, aluminum, gallium, indium, chlorine, bromine and iodine.

9. A semiconductor device having an ohmic contact suitable for use at temperatures at least as low as 20° K. comprising a semi-conductor body selected from the group consisting of a cadmium sulphide crystal, a cadmium selenide crystal and a gallium arsenide crystal, said body containing a layer of degenerate carrier selected from the group consisting of boron, aluminum, gallium, indium, excess cadmium, chlorine, bromine and iodine, said layer having an impurity concentration of at least $10^{17}/\text{cm.}^3$ provided in the surface of said semiconductor body.

References Cited

UNITED STATES PATENTS

| | | | |
|---|---|---|---|
| 3,287,611 | 11/1966 | Bockemuehl et al. | 317—235 |
| 3,351,502 | 11/1967 | Rediker | 148—177 |
| 3,357,872 | 12/1967 | Belasco | 148—175 |
| 3,401,107 | 9/1968 | Redington | 204—164 |
| 3,366,518 | 1/1968 | Esaki et al. | 148—177 |
| 3,385,981 | 5/1968 | Mayer et al. | 307—299 |

JOHN W. HUCKERT, Primary Examiner

S. BRODER, Assistant Examiner

U.S. Cl. X.R.

29—580; 148—33.3